United States Patent
Gouk et al.

(10) Patent No.: US 10,727,083 B1
(45) Date of Patent: Jul. 28, 2020

(54) METHOD FOR VIA FORMATION IN FLOWABLE EPOXY MATERIALS BY MICRO-IMPRINT

(71) Applicant: Applied Materials, Inc., Santa Clara, CA (US)

(72) Inventors: Roman Gouk, San Jose, CA (US); Chintan Buch, Santa Clara, CA (US); Kyuil Cho, Santa Clara, CA (US); Han-Wen Chen, Cupertino, CA (US); Steven Verhaverbeke, San Francisco, CA (US); Vincent Dicaprio, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/284,595

(22) Filed: Feb. 25, 2019

(51) Int. Cl.
*G03F 7/00* (2006.01)
*H01L 21/48* (2006.01)

(52) U.S. Cl.
CPC .......... *H01L 21/486* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 6,716,767 B2 | 4/2004 | Shih et al. | |
| 7,906,180 B2 | 3/2011 | Xu et al. | |
| 8,545,709 B2* | 10/2013 | Brooks | B82Y 10/00 216/41 |
| 9,372,399 B2 | 6/2016 | Van Der Mark et al. | |
| 10,189,203 B2* | 1/2019 | Youn | G03F 7/0002 |
| 2008/0113283 A1* | 5/2008 | Ghoshal | G03F 7/0755 430/22 |
| 2008/0220566 A1* | 9/2008 | Hsieh | H01L 23/5389 438/118 |

* cited by examiner

*Primary Examiner* — Ali Naraghi
(74) *Attorney, Agent, or Firm* — Patterson & Sheridan, LLP (57) ABSTRACT

The present disclosure generally relates to methods of micro-imprinting panels or substrates for advanced packaging applications. A redistribution layer comprising an epoxy material is deposited on a substrate layer and imprinted with a stamp to form an epoxy substrate patterned with a plurality of vias. The stamp is removed from the epoxy substrate, and the epoxy substrate is optionally etched with a plasma comprising oxygen to prevent the redistribution layer from becoming flowable when cured. A capping layer may optionally be deposited on the surface of the epoxy substrate.

20 Claims, 6 Drawing Sheets

METHOD FOR VIA FORMATION IN FLOWABLE EPOXY MATERIALS BY MICRO-IMPRINT

BACKGROUND

Field

Embodiments of the present disclosure generally relate to methods of micro-imprinting panels or substrates for advanced packaging applications.

Description of the Related Art

As circuit densities increase and device sizes decrease for next generation semiconductor devices, providing the external connections, i.e., wiring, to these devices requires advanced packaging technologies. One such packaging technology is wafer level packaging. Wafer level packaging streamlines the manufacturing and packaging processes of semiconductor devices by integrating device manufacturing, package assembly (packaging), electrical testing, and reliability testing (burn-in) at the wafer level, where forming of the top and bottom layers of the packaging, creating the I/O connections, and testing the packaged device are all performed before the devices are singulated into individual packaged components. The advantages of wafer level packaging include reduced overall manufacturing costs of the resulting device, reduced package size, and improved electrical and thermal performance.

Wafer level packaging generally comprises depositing a redistribution layer on a substrate layer, and forming a plurality of vias in the redistribution layer using lithography processes. Using conventional lithography process to form the plurality of vias can be expensive, waste material, lack resolution beyond 7 µm in advanced node high density redistribution layers, and be very sensitive to surface topologies. Additionally, redistribution layers comprised of a flowable epoxy material may be extremely difficult to pattern using a conventional lithography process. One solution to form a plurality of vias in a redistribution layer comprised of a flowable epoxy material is to use laser drilling. However, vias formed by laser drilling lack resolution beyond 20 µm. Using these methods to deposit and pattern the redistribution layer may result in a significant amount of excess material being wasted, and may make controlling the size and depth of the vias difficult to control.

Accordingly, there is a need in the art for improved methods of depositing and forming vias in redistribution layers in wafer level packaging schemes.

SUMMARY

The present disclosure generally relates to methods of micro-imprinting panels or substrates for advanced packaging applications. A redistribution layer comprising an epoxy material is deposited on a substrate layer and imprinted with a stamp to form an epoxy substrate patterned with a plurality of vias. The stamp is removed from the epoxy substrate, and the epoxy substrate is optionally etched with a plasma comprising oxygen to prevent the redistribution layer from becoming flowable when cured. A capping layer may optionally be deposited on the surface of the epoxy substrate.

In one embodiment, a method of forming a plurality of vias in a substrate comprises depositing a redistribution layer comprising an epoxy material on a substrate layer to form an epoxy substrate. The epoxy material is flowable between about 90 to 160 degrees Celsius. The method further comprises imprinting the redistribution layer with a stamp at a temperature less than a curing temperature of the redistribution layer to pattern the epoxy substrate with a plurality of vias and removing the stamp from the patterned epoxy substrate. Each of the plurality of vias has a first depth extending to the substrate layer when the stamp is removed. The method further comprises etching the patterned epoxy substrate using a plasma comprising oxygen and curing the patterned epoxy substrate. Etching the patterned epoxy substrate using the plasma comprising oxygen prevents the epoxy material of the redistribution layer from reflowing during curing. Each of the plurality of vias has the first depth extending to the substrate layer upon being cured.

In another embodiment, a method of forming a plurality of vias in a substrate comprises depositing a flowable epoxy layer on a substrate layer to form an epoxy substrate. The flowable epoxy material is flowable between about 90 to 160 degrees Celsius. The method further comprises aligning a stamp above the flowable epoxy layer, pre-heating the epoxy substrate, imprinting the flowable epoxy layer with the stamp at a temperature between about 90 to 160 degrees Celsius to pattern the epoxy substrate with a plurality of vias, cooling the stamp and the patterned epoxy substrate, removing the stamp from the patterned epoxy substrate. Each of the plurality of vias has a first depth extending to the substrate layer when the stamp is removed. The method further comprises depositing a capping layer on the patterned epoxy substrate and curing the patterned epoxy substrate. Each of the plurality of vias has the first depth extending to the substrate layer upon being cured.

In yet another embodiment, a method of forming a plurality of vias in a substrate comprises laminating a redistribution layer comprising an epoxy material on a substrate layer to form an epoxy substrate. The epoxy material is flowable between about 90 to 160 degrees Celsius. The method further comprises aligning a stamp above the redistribution layer, pre-heating the epoxy substrate to a temperature less than a curing temperature of the redistribution layer, imprinting the redistribution layer with the stamp in vacuum to pattern the epoxy substrate with a plurality of vias, removing the stamp from the patterned epoxy substrate. Each of the plurality of vias has a first depth extending to the substrate layer when the stamp is removed. The method further comprises cleaning the plurality of vias and curing the patterned epoxy substrate. Each of the plurality of vias has the first depth extending to the substrate layer upon being cured.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods of micro-imprinting panels or substrates for advanced packaging applications. A redistribution layer comprising an epoxy material is deposited on a substrate layer and imprinted with a stamp to form an epoxy substrate patterned with a plurality of vias. The stamp is removed from the epoxy substrate, and the epoxy substrate is optionally etched with a plasma comprising oxygen to prevent the redistribution layer from becoming flowable when cured. A capping layer may optionally be deposited on the surface of the epoxy substrate.

FIGS. 1A-1H illustrate various stages of micro-imprinting a redistribution layer 104 on an epoxy substrate 100 to form a plurality of vias 110. FIG. 2 illustrates a method 200 of micro-imprinting a redistribution layer on an epoxy substrate to form a plurality of vias, according to one embodiment. While FIGS. 1A-1H are shown in in a particular sequence, it is also contemplated that the various stages of method 200 depicted in FIGS. 1A-1H can be performed in any suitable order. To facilitate a clearer understanding of the method 200, elements of method 200 of FIG. 2 will be described and demonstrated using the various views of the epoxy substrate 100 of FIGS. 1A-1H. While elements of method 200 are described using FIGS. 1A-1H, other operations not shown in FIGS. 1A-1H may be included.

Figure 1A:
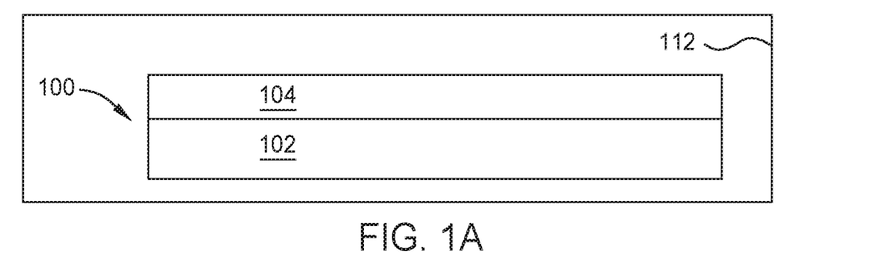
FIGS. 1A-1H illustrate various stages of micro-imprinting a redistribution layer on an epoxy substrate to form a plurality of vias, according to one embodiment.
Figure 2:
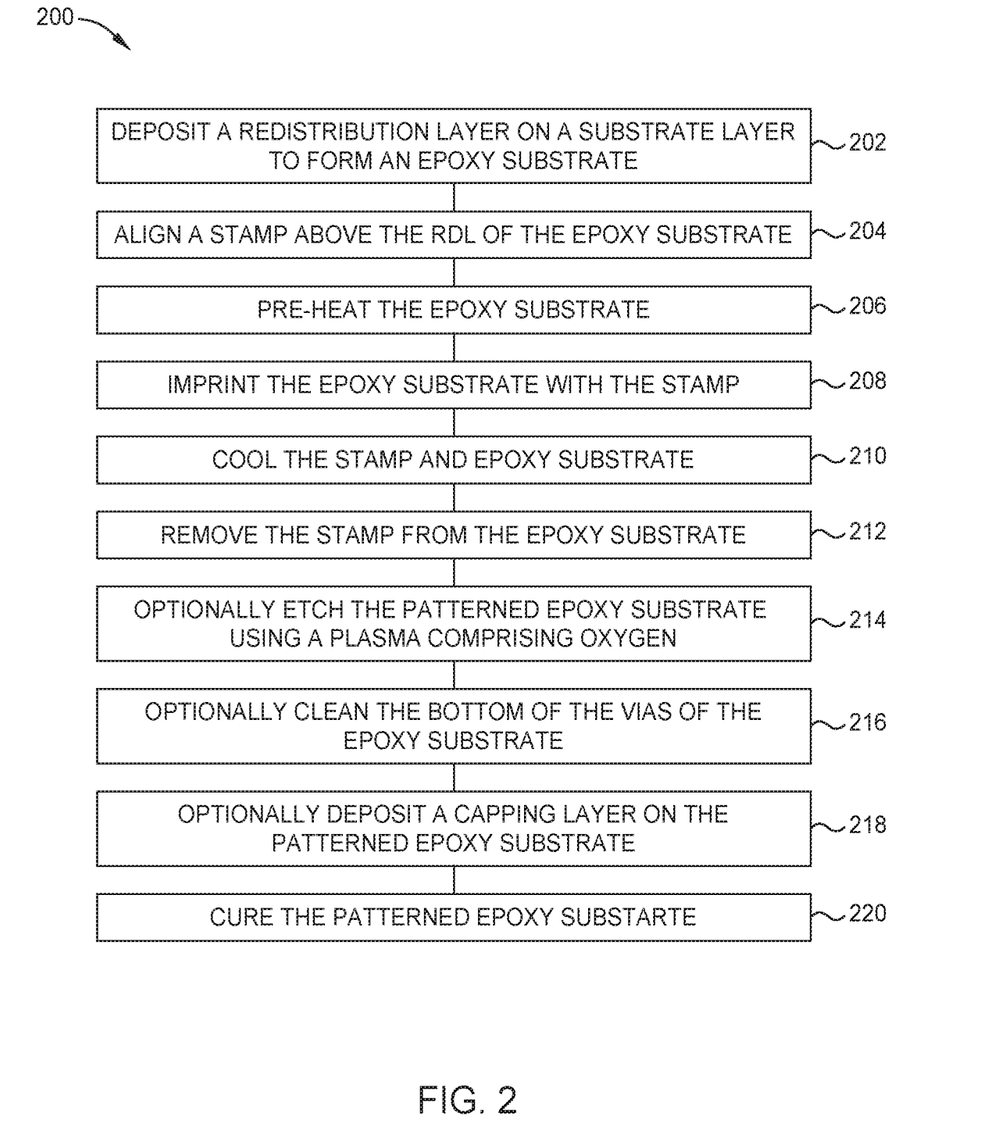
FIG. 2 illustrates a method of micro-imprinting a redistribution layer on an epoxy substrate to form a plurality of vias, according to one embodiment.

FIG. 1A illustrates a cross-sectional view of an epoxy substrate 100, or a portion of a panel or wafer, having a redistribution layer (RDL) 104 being deposited on a substrate layer 102 in a first chamber 112, as performed in operation 202 of method 200 of FIG. 2. In one embodiment, the substrate layer 102 comprises copper or aluminum. The substrate layer 102 may be coated or laminated in copper. The RDL 104 comprises a dielectric layer, metal wiring, and one or more vias. The dielectric layer of the RDL 104 is an epoxy-based dielectric material. The dielectric layer of the RDL 104 comprises a flowable epoxy material, such as silica. A flowable epoxy material is a material that that flows at a certain temperature range, such as about 90-160 degrees Celsius, and hardens when cured at temperatures exceeding the certain temperature range, such as about 180 degrees Celsius and above. In other words, a flowable epoxy material is a material that is solid at temperatures below about 80 degrees Celsius and above temperatures of about 180 degrees Celsius, and flowable at temperatures between about 90-160 degrees Celsius. Temperatures of about 80-90 degrees Celsius and 160-180 degrees Celsius are transition ranges where the epoxy material transitions from solid to flowable, or vice versa.

The dielectric layer of the RDL 104 may comprise high density filled flowable epoxy material. The dielectric layer of the RDL 104 may be a flowable epoxy compound comprising silica particle fillers or a silica filled dielectric material, as flowable epoxy materials filled with silica particles still exhibit flowable characteristics. Silica particles may be added to the RDL 104 to adjust the dielectric properties of the flowable epoxy material of the dielectric layer. The RDL 104 may be deposited by a lamination process at a temperature between about 90-120 degrees Celsius and at a pressure between about 5-7 bar. The RDL 104 may have a thickness between about 5-50 µm.

Figure 1B:
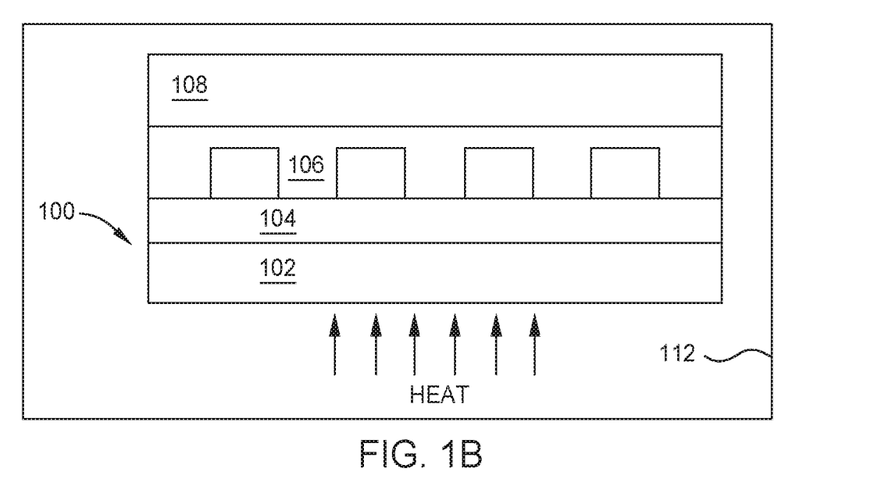

FIG. 1B illustrates a cross-sectional view of aligning a stamp 106 above the RDL 104 of the epoxy substrate 100 in the first chamber 112, as performed in operation 204 of method 200. The stamp 106 may be bound to a backing 108 comprising a UV transparent material, such as glass substrate, to prevent dimensional distortions from occurring due to thermal expansion during an imprint process. The stamp 106 may be cured at a temperature of about 250 degrees Celsius for about 1 hour to reduce outgassing and to improve thermal performance.

The stamp 106 is aligned above the RDL 104 such that the stamp 106 is spaced from the RDL 104 by about 100-500 nm. After alignment of the stamp 106, vacuum may be applied to the first chamber 112. The RDL 104 is then pre-heated to about 90-160 degrees Celsius, as preformed in operation 206 of method 200. The RDL 104 may be heated to a temperature less than the curing temperature of the RDL 104, such as a temperature 40-80 degrees Celsius less than the curing temperature of the RDL 104. The RDL 104 may be heated using a chuck (not shown) disposed below the substrate layer 102. The RDL 104 may be heated through the substrate layer 102 by heating the chuck or by infrared radiation. Alternatively, or additionally, the RDL 104 may be heated by heating the stamp 106 disposed above the RDL 104.

Figure 1C:
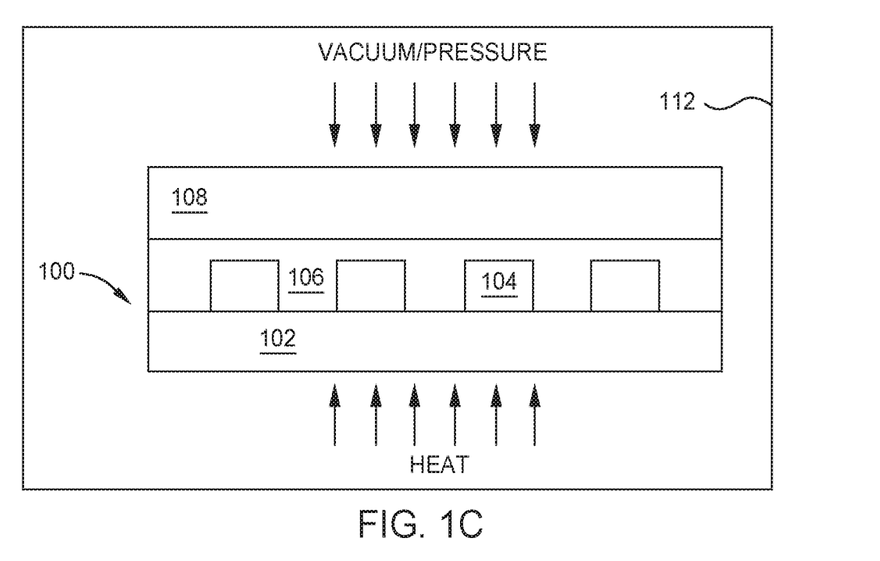

FIG. 1C illustrates a cross-sectional view of imprinting the heated RDL 104 with the stamp 106 in the first chamber 112, as performed in operation 208 of method 200. The first chamber 112 may maintain a temperature between about 90-160 degrees Celsius during the imprinting process. In one embodiment, the first chamber 112 maintains a temperature less than a curing temperature of the RDL 104, such as a temperature 40-80 degrees Celsius less than the curing temperature of the RDL 104. The stamp 106 may contact the RDL 104 in a vacuum environment between about 0.1-10 torr. A pressure between about 1-3 bar may then be applied to the stamp 106 for about 0.5-3 minutes, resulting in the reverse tone image of the pattern of the stamp 106 in the RDL 104 (i.e. the pillars of the stamp 106 creating vias 110 or holes in the RDL 104). The pressure may be applied in stages, such as applying pressure of about 1 bar, then increasing the pressure to about 2 bar, and then further increasing the pressure to about 3 bar.

Figure 1D:
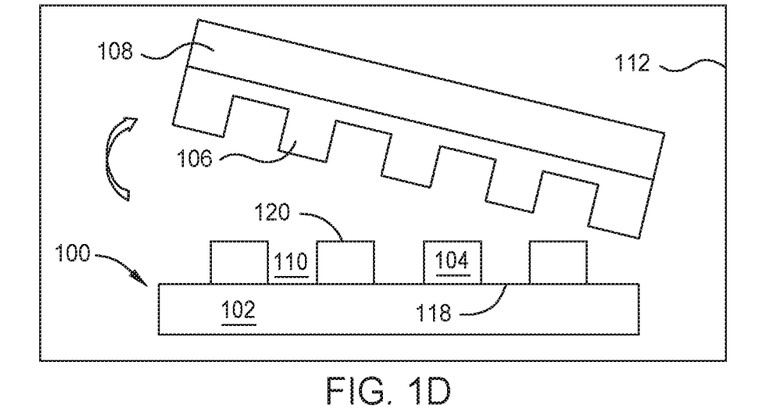

FIG. 1D illustrates a cross-sectional view of removing or demolding the stamp 106 from the RDL 104 after the stamp 106 and epoxy substrate 100 have been cooled, as performed in operations 210 and 212 of method 200. The stamp 106 and epoxy substrate 100 may be cooled to a temperature of 80 degrees Celsius or less prior to detaching the stamp 106. After the stamp 106 is removed, the RDL 104 comprises a plurality of vias 110, forming a patterned epoxy substrate 100. Each of the vias 110 extends through the RDL 104 to the substrate layer 102 to eliminate a residual thickness layer (RTL), or an amount of the material of the RDL 104 remaining between the surface of the substrate layer 102 contacting the RDL 104 and the bottom 118 of an imprinted via 110 after being micro-imprinted with the stamp 106. Each of the vias 110 may have a diameter between about 2-50 µm and a height or depth of about 5-20 µm.

Figure 1E:
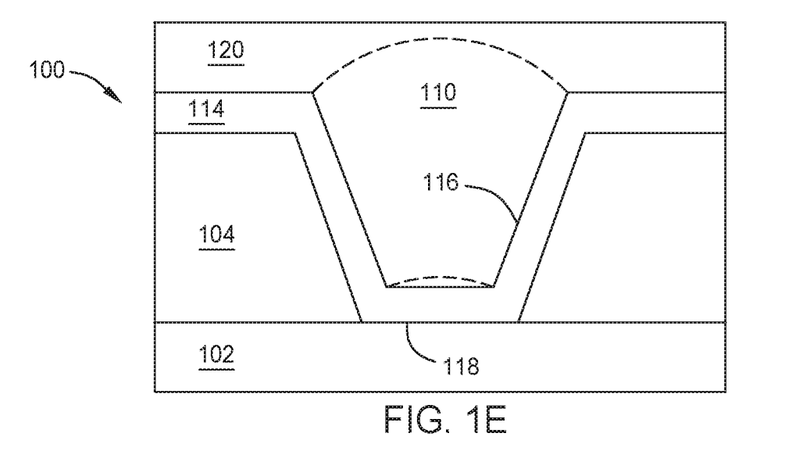

FIG. 1E illustrates a cross-sectional and zoomed-in view of a via 110 patterned on the epoxy substrate 100. Following the removal of the stamp 106 from the RDL 104, a residue layer 114 may be disposed on the sides 116 of the vias 110, the bottom 118 of the vias 110, and the top surface 120 of the epoxy substrate 100. The residue layer 114 may comprise particles of the dielectric layer of the RDL 104, such as silica particles, and may not be a complete or conformal layer.

Figure 1F:
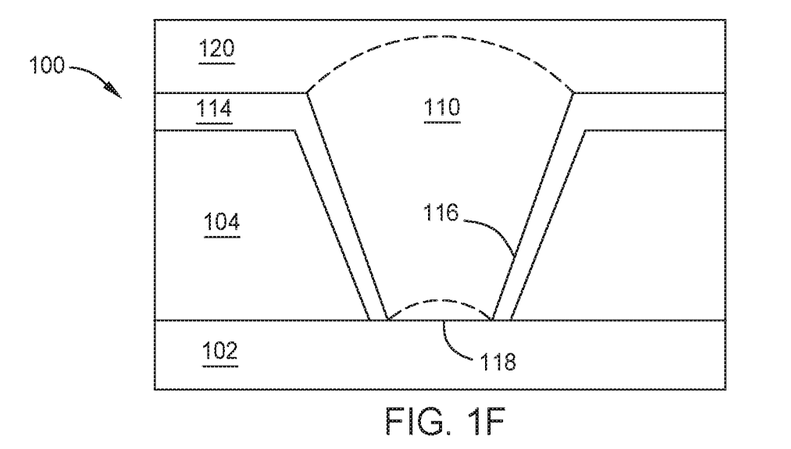

FIG. 1F illustrates a cross-sectional and zoomed-in view of the via 110 after the epoxy substrate 100 has been etched with a plasma comprising oxygen, as performed in operation 214 of method 200. In operation 214, the exposed surfaces of the epoxy substrate 100 (i.e, the top surface 120, the sides 116 of the vias 110, and the bottom 118 of the vias 110) may be conditioned and the residue layer 114 may be pre-cleaned from the bottom 118 of the vias 110 by etching the patterned epoxy substrate 100 using the plasma comprising oxygen. The plasma etching of operation 214 of method 200 is optional.

Conditioning the exposed surfaces 116, 118, 120 of the epoxy substrate 100 may prevent the substrate layer 102 exposed at the bottom 118 of the vias 110 from wrinkling during a curing process (described below in operation 220), and may reduce a surface roughness of the exposed surfaces 116, 118, 120 of the epoxy substrate 100. The exposed surfaces, such as the substrate layer 102 exposed at the bottom 118 of the vias 110, may wrinkle and/or become rough due to outgassing occurring during the curing process. Additionally, the plasma etching of operation 214 of method 200 may prevent the RDL 104 from becoming flowable (i.e., freeze the RDL 104) during the curing process, preventing the vias 110 from having a reduced depth due to the reflow of the RDL 104. Plasma etching the epoxy substrate 100 may further prevent cross-linking of the epoxy in the RDL 104, allowing the curing temperature of the epoxy substrate 100 to be reduced.

The plasma comprising oxygen may be an $O_2$/Ar plasma. The epoxy substrate 100 may be transferred from the first chamber 112 to a second chamber (not shown) for the plasma etching process. The plasma etching may occur for about 1-7 minutes at a power of about 300 watts and a bias of about 50 watts. The plasma etching of the epoxy substrate 100 may remove the residue layer 114 almost completely from the bottom 118 of the vias 110, and may remove a portion of the residue layer 114 from the sides 116 of the vias 110 and the top surface 120 of the epoxy substrate 100.

Figure 1G:
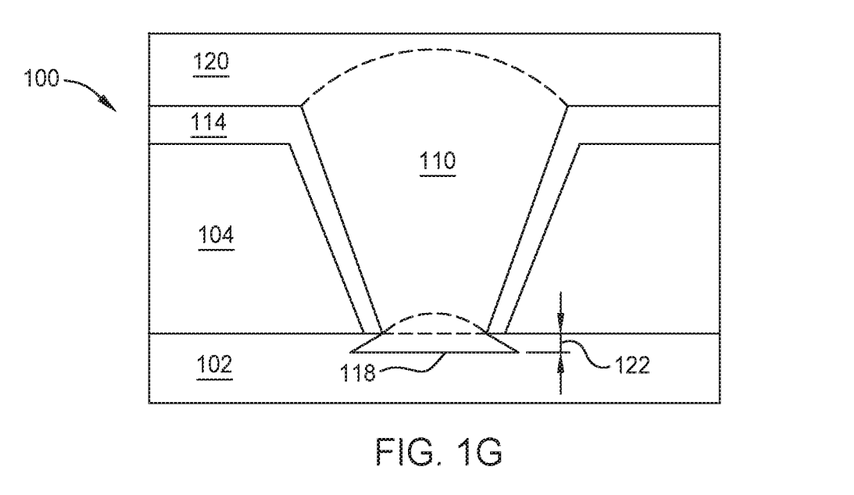

FIG. 1G illustrates a cross-sectional and zoomed-in view of the via 110 after a cleaning and undercutting process, as performed in operation 216 of method 200. In operation 216, the bottom 118 of each of the vias 110 is optionally cleaned to undercut the bottom 118 of the vias 110 into the substrate layer 102. The bottom 118 of the vias 110 may be cleaned and undercut via etching in a wet bath with ultrasonic agitation using a copper chloride/methanol ($CuCl_2/CH_3OH$) mixture of about 0.2-1 M. The ultrasonic agitation may lift up any remaining particles of the residue layer 114 from the bottom 118 of the vias 110. The ultrasonic agitation may be utilized because the methanol of the $CuCl_2/CH_3OH$ mixture does not produce violent cavitation and does not damage the epoxy material of the RDL 104.

The cleaning and undercutting of the vias 110 etches into the substrate layer 102 to lower the bottom 118 of the vias 110 by a distance 122 of about 0.1-2 μm. The $CuCl_2/CH_3OH$ mixture utilized allows the cleaning and undercutting process to be uniform and controlled, as the $CuCl_2/CH_3OH$ mixture does not etch along copper grain boundaries of the substrate layer 102. Undercutting the substrate layer 102 enables a clear connection to be formed between the substrate layer 102 and subsequently deposited metal layers (i.e., a connection unobstructed by the residue layer 114). Additionally, the cleaning and undercutting process may remove the residue layer 114 from the bottom 118 of the vias 110, and from at least a portion of the sides 116 of the vias 110 and the top surface 120 of the epoxy substrate 100, such as when operation 214 is not performed. Following the cleaning and undercutting process, the epoxy substrate 100 may be rinsed with 1% hydrochloric acid to remove particles of the substrate layer 102 remaining after the cleaning and undercutting process from the bottom 118 of the vias 110, such as copper oxide, and then dried.

Figure 1H:
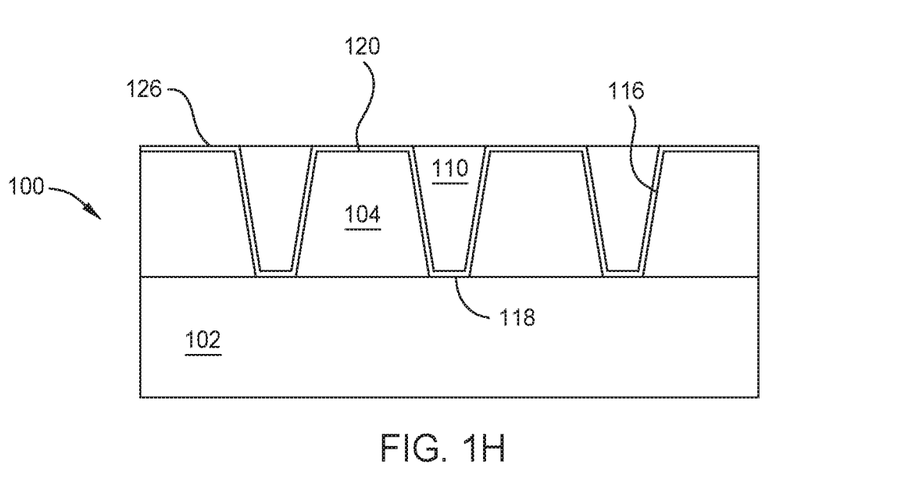

FIG. 1H illustrates a cross-sectional and zoomed-in view of the via 110 having a capping layer 126 deposited, as performed in operation 218 of method 200. To prevent the RDL 104 of the epoxy substrate 100 from becoming flowable during a curing process, which may reduce the depth of the vias 110, a capping layer 126 may optionally be deposited to coat the exposed surfaces of the epoxy substrate 100 (i.e., the top surface 120, the sides 116 of the vias 110, and the bottom 118 of the vias 110). The capping layer 126 is a flow-restricting layer that prevents the RDL 104 from being flowable when cured or oven baked (i.e., freezes the RDL 104). The capping layer 126 may further minimize surface roughness of the top surface 120 when the epoxy substrate 100 is cured. Depositing the capping layer 126 is optional because the plasma etching of operation 214 of method 200 may prevent the RDL 104 from becoming flowable when cured or oven baked such that the capping layer 126 is not needed. Operations 214, 216, and 218 are individually optionally; however, at least one of operations 214, 216, or 218 is performed in method 200.

The capping layer 126 may be deposited using physical vapor deposition (PVD). The capping layer 126 may be comprised of a material selected from the group consisting of Cu, Ti/Cu, SiO, Ni, among others. The capping layer 126 may have a thickness between about 20-300 nm. The epoxy substrate 100 may then be cured in vacuum or by oven baking at a temperature between about 180-200 degrees Celsius for about 1 hour, as performed in operation 220 of method 200. The epoxy substrate 100 may be cured in a $N_2$ oven. Following the curing of the epoxy substrate 100, one or more metal layers may be deposited on the epoxy substrate 100 and in the vias 110, creating I/O connections for advanced packaging technologies.

In one embodiment, the capping layer 126 is deposited after the stamp 106 is removed from the epoxy substrate 100 (i.e., operation 218 of method 200 may directly follow operation 212). In another embodiment, the capping layer 126 is deposited after the epoxy substrate 100 has been plasma etched (i.e., operation 218 of method 200 may directly follow operation 214). In yet another embodiment, the bottom 118 of the vias 110 are cleaned directly after the stamp 106 is removed from the epoxy substrate 100, after which the capping layer 126 is deposited (i.e., operation 216 may directly follow operation 212, and then proceed to operation 218). In yet another embodiment, the stamp 106 is removed from the epoxy substrate 100 in operation 212, the epoxy substrate 100 is plasma etched in operation 214, the bottom 118 of the vias 110 are cleaned in operation 216, and then the capping layer 126 is deposited in operation 218.

Figure 3A:
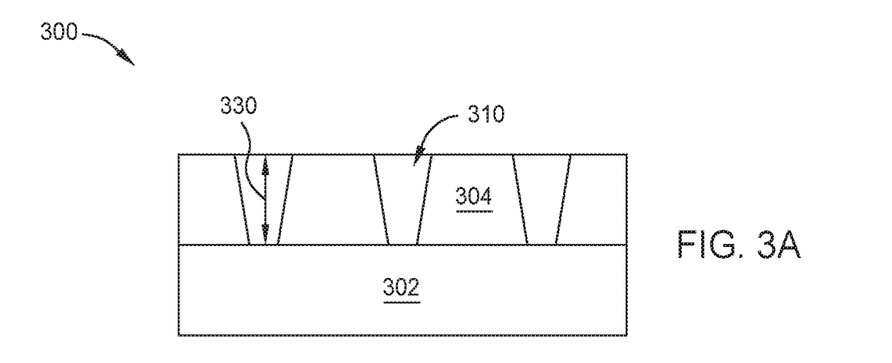
FIGS. 3A-3C illustrate a redistribution layer of an epoxy substrate becoming flowable upon curing, according to one embodiment.
Figure 3B:
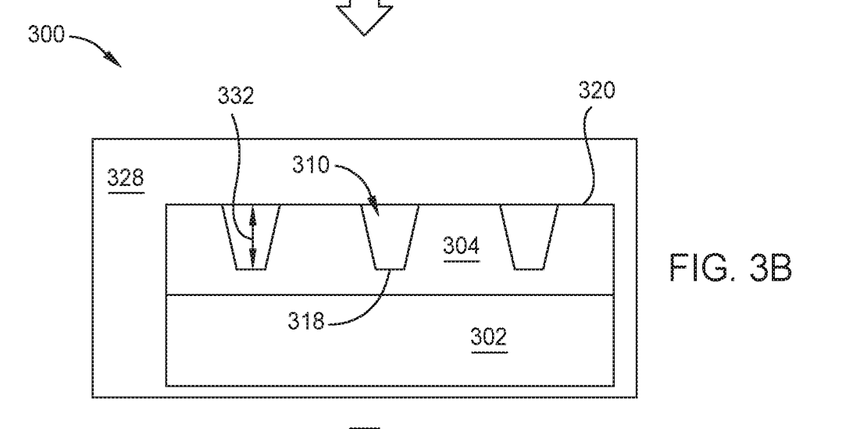
Figure 3C:
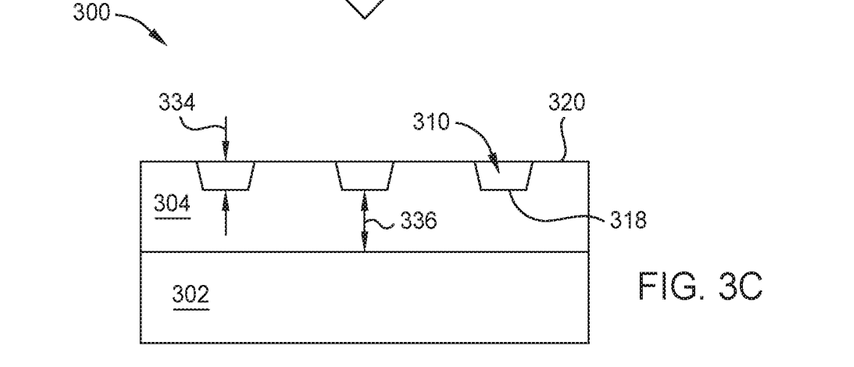

FIGS. 3A-3C illustrate a RDL 304 of an epoxy substrate 300 becoming flowable upon curing. The epoxy substrate 300 of FIGS. 3A-3C was not etched following the removal of an imprint stamp from a RDL 104, like performed in operation 214 of method 200, and a capping layer was not deposited on the epoxy substrate 300, like performed in operation 216 of method 200.

FIG. 3A illustrates the epoxy substrate 300 comprising a substrate layer 302 and a patterned RDL 304. The RDL 304 comprises a plurality of vias 310 having a first depth 330, which were formed immediately following the removal of an imprint stamp, such as the stamp 106 of FIGS. 1A-1H and as performed in operation 212 of method 200. The first depth 330 of the vias 310 may extend from a top surface 320 of the RDL 304 down to the substrate layer 302 such that the epoxy substrate 300 does not have a RTL when the imprinting stamp is demolded.

FIG. 3B illustrates the epoxy substrate 300 being cured in a chamber or oven 328. The epoxy substrate 300 may be cured using any method described above. As the epoxy substrate 300 is cured, the RDL 304 becomes flowable once again, reducing the depth of the vias 310 to a second depth 332 less than the first depth 330. As such, the bottom 318 of the vias 310 may no longer extend down to the substrate layer 302. Instead, the vias 310 may extend from the top surface 320 only partially through the RDL 304. While shown at the second depth 332, the depth of the vias 310 is continuously reduced as the RDL 304 reflows throughout the curing process.

FIG. 3C illustrates the epoxy substrate 300 after the curing process. Due to the RDL 304 becoming flowable during the curing process, the vias 310 are cured to have a third depth 334 that is less than the second depth 332, extending from the top surface 320 only partially through the RDL 304. Since the RDL 304 reflows during the curing process, the RDL 304 flows over the bottom of the vias 310 such that the vias 310 have a RTL 336. Because the vias 310 now have an RTL 336 and no longer extend through the RDL 304 to the substrate layer 302, a clear connection may no longer be formed between the substrate layer 302 and subsequently deposited metal layers, as the RDL 304 will be disposed between the substrate layer 302 and any subsequently deposited metal layers.

Figure 4A:
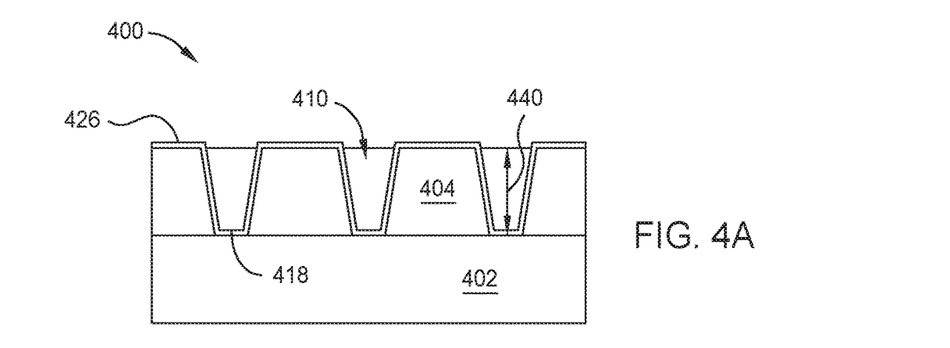
FIGS. 4A-4C illustrate a redistribution layer of an epoxy substrate prevented from becoming flowable during a curing process, according to one embodiment.
Figure 4B:
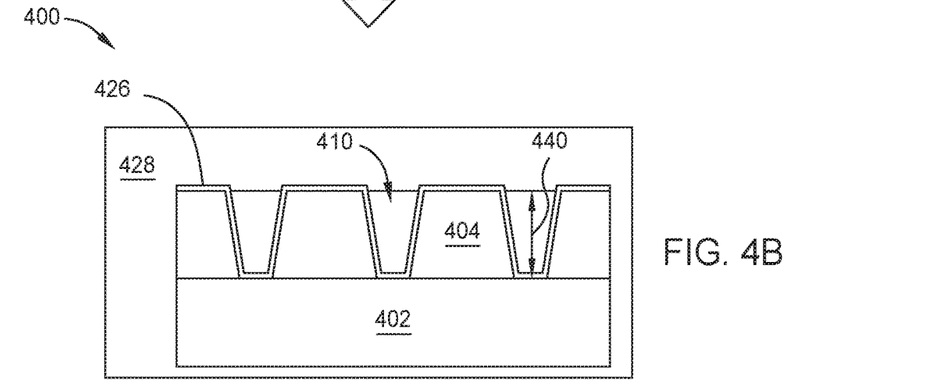
Figure 4C:
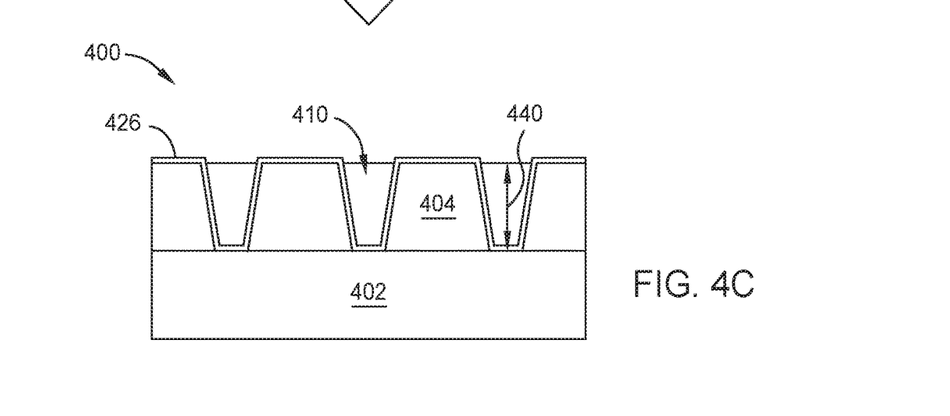

FIGS. 4A-4C illustrate a RDL 404 of an epoxy substrate 400 prevented from becoming flowable during a curing process. The epoxy substrate 400 may be the epoxy substrate 100 of FIGS. 1A-1H, and may be formed using method 200 of FIG. 2. FIG. 4A illustrates the epoxy substrate 400 comprising a substrate layer 402 and a patterned RDL 404. The RDL 404 comprises a plurality of vias 410 having a first depth 440, which were formed following the removal of an imprint stamp, such as the stamp 106 of FIGS. 1A-1H and as performed in operation 212 of method 200. The first depth 440 of the vias 410 extends down to the substrate layer 402.

Following the removal of the imprint stamp, the epoxy substrate 400 was plasma etched, as performed in operation 214 of method 200, and a capping layer 426 was deposited on the exposed surfaces of the epoxy substrate, as performed in operation 218 of method 200. The capping layer 426 may be the capping layer 126 of FIG. 1H. The capping layer 426 is deposited on the bottom 418 of the vias 410 such that the capping layer 426 contacts the substrate layer 402. The bottom 418 of the vias 410 may have been cleaned and undercut following the plasma etching, as performed in operation 216 of method 200.

FIG. 4B illustrates the epoxy substrate 400 being cured in a chamber or oven 428, as described in operation 220 of method 200. The epoxy substrate 400 may be cured using any method described above. As the epoxy substrate 400 is cured, the plasma etching and/or the capping layer 426 prevent the RDL 404 from becoming flowable. As such, the vias 410 each maintain the first depth 440 throughout the curing process, as the RDL 404 does not reflow over the bottom 418 of the vias 410.

FIG. 4C illustrates the epoxy substrate 400 after the curing process. Following the curing process, the vias 410 of the cured epoxy substrate 400 have the first depth 440 extending down to the substrate layer 402. Since the vias 410 still extend through the RDL 404 to the substrate layer 402 and do not have an RTL, a clear connection unobstructed by the RDL 404 may be formed between the substrate layer 402 and any subsequently deposited metal layers.

By plasma etching and/or depositing a capping layer on a patterned epoxy substrate prior to curing the epoxy substrate, each of the vias patterned on the epoxy substrate maintain a depth that extends down to the substrate layer. The vias maintaining a depth that extends to the substrate layer enables a clear connection to be formed between the substrate layer and any subsequently deposited metal layers, creating unobstructed I/O connections for advanced packaging technologies. Additionally, plasma etching and/or depositing a capping layer on a patterned epoxy substrate reduces the surface roughness of the patterned RDL and helps prevent the substrate layer from wrinkling during the curing process, further enabling a clear connection to be formed between the substrate layer and any subsequently deposited metal layers. Furthermore, the vias formed in the RDL may have a resolution of less than 5 μm, exceeding the capabilities of laser drilled vias.

While the foregoing is directed to embodiments of the present disclosure, other and further embodiments of the disclosure may be devised without departing from the basic scope thereof, and the scope thereof is determined by the claims that follow.

What is claimed is:

1. A method of forming a plurality of vias in a substrate, comprising:
   depositing a redistribution layer comprising an epoxy material on a substrate layer to form an epoxy substrate, the epoxy material being flowable between about 90 to 160 degrees Celsius;
   imprinting the redistribution layer with a stamp at a temperature less than a curing temperature of the redistribution layer to pattern the epoxy substrate with a plurality of vias;
   removing the stamp from the patterned epoxy substrate, wherein each of the plurality of vias has a first depth extending to the substrate layer when the stamp is removed;
   etching the patterned epoxy substrate using a plasma comprising oxygen; and
   curing the patterned epoxy substrate, wherein etching the patterned epoxy substrate using the plasma comprising oxygen prevents the epoxy material of the redistribution layer from reflowing during curing, and wherein each of the plurality of vias has the first depth extending to the substrate layer upon being cured.

2. The method of claim 1, wherein the redistribution layer comprises a high density filled epoxy material.

3. The method of claim 1, wherein the patterned epoxy substrate is etched using the plasma comprising oxygen for about one minute to condition a surface of the patterned epoxy substrate and to remove residues of the redistribution layer from a bottom of each of the plurality of vias.

4. The method of claim 1, wherein the substrate layer is coated or laminated in copper prior to depositing the redistribution layer.

5. The method of claim 1, further comprising cooling the stamp and patterned epoxy substrate to about 80 degrees Celsius or less after removing the stamp from the epoxy substrate.

6. The method of claim 1, wherein etching the patterned epoxy substrate using the plasma comprising oxygen further cleans the plurality of vias.

7. A method of forming a plurality of vias in a substrate, comprising:
   depositing a flowable epoxy layer on a substrate layer to form an epoxy substrate, the flowable epoxy material being flowable between about 90 to 160 degrees Celsius;
   aligning a stamp above the flowable epoxy layer;
   pre-heating the epoxy substrate;
   imprinting the flowable epoxy layer with the stamp at a temperature between about 90 to 160 degrees Celsius to pattern the epoxy substrate with a plurality of vias;
   cooling the stamp and the patterned epoxy substrate;
   removing the stamp from the patterned epoxy substrate, wherein each of the plurality of vias has a first depth extending to the substrate layer when the stamp is removed;
   depositing a capping layer on the patterned epoxy substrate; and
   curing the patterned epoxy substrate, wherein each of the plurality of vias has the first depth extending to the substrate layer upon being cured.

8. The method of claim 7, wherein the flowable epoxy layer comprises silica filler particles, and wherein the stamp and patterned epoxy substrate are cooled to about 80 degrees Celsius or less.

9. The method of claim 7, further comprising undercutting a bottom of each of the plurality of vias into the substrate layer using copper chloride and methanol after removing the stamp from the patterned epoxy substrate.

10. The method of claim 9, further comprising applying ultrasonic agitation to the epoxy substrate as each of the bottoms of the plurality of vias is undercut.

11. The method of claim 7, wherein the capping layer is comprised of a material selected from the group consisting of Cu, Ti/Cu, SiO, and Ni.

12. The method of claim 7, wherein the capping layer has a thickness between about 20 nm to 300 nm.

13. A method of forming a plurality of vias in a substrate, comprising:
   laminating a redistribution layer comprising an epoxy material on a substrate layer to form an epoxy substrate, the epoxy material being flowable between about 90 to 160 degrees Celsius;
   aligning a stamp above the redistribution layer;
   pre-heating the epoxy substrate to a temperature less than a curing temperature of the redistribution layer;
   imprinting the redistribution layer with the stamp in vacuum to pattern the epoxy substrate with a plurality of vias;
   removing the stamp from the patterned epoxy substrate, wherein each of the plurality of vias has a first depth extending to the substrate layer when the stamp is removed;
   cleaning the plurality of vias; and
   curing the patterned epoxy substrate, wherein each of the plurality of vias has the first depth extending to the substrate layer upon being cured.

14. The method of claim 13, wherein the substrate layer is coated or laminated in copper prior to laminating the redistribution layer, and wherein the epoxy material of the redistribution layer is a high density filled flowable epoxy material.

15. The method of claim 13, wherein the epoxy material of the redistribution layer comprises silica filler particles.

16. The method of claim 13, further comprising etching the patterned epoxy substrate using a plasma comprising oxygen prior to cleaning the plurality of vias, wherein the patterned epoxy substrate is etched using the plasma comprising oxygen for about one minute to condition a surface of the patterned epoxy substrate and to remove residues of the redistribution layer from a bottom of each of the plurality of vias.

17. The method of claim 16, further comprising depositing a capping layer on the patterned epoxy substrate after cleaning the plurality of vias.

18. The method of claim 13, wherein the plurality of vias are cleaned using copper chloride and methanol.

19. The method of claim 18, wherein cleaning the plurality of vias etches a bottom of each of the plurality of vias to extend the bottom of each of the plurality of vias into the substrate layer, wherein the bottom of each of the plurality of vias extends into the substrate layer by about 0.1 micrometers to 2 micrometers.

20. The method of claim 18, wherein cleaning the plurality of vias comprises applying ultrasonic agitation to the epoxy substrate.

* * * * *